US008122416B2

(12) United States Patent
Saito et al.

(10) Patent No.: US 8,122,416 B2
(45) Date of Patent: Feb. 21, 2012

(54) ARRANGEMENT VERIFICATION APPARATUS

(75) Inventors: Ken Saito, Tokyo (JP); Wataru Uchida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 364 days.

(21) Appl. No.: 12/401,408

(22) Filed: Mar. 10, 2009

(65) Prior Publication Data
US 2009/0259978 A1 Oct. 15, 2009

(30) Foreign Application Priority Data

Apr. 10, 2008 (JP) ................................. 2008-102229

(51) Int. Cl.
*G06F 17/50* (2006.01)
*G06F 9/455* (2006.01)
(52) U.S. Cl. .................... 716/122; 716/106; 716/111
(58) Field of Classification Search .......... 716/118–119, 716/122–125, 106, 111
See application file for complete search history.

(56) References Cited

U.S. PATENT DOCUMENTS

| 6,523,157 | B1 * | 2/2003 | Takahashi et al. ............ 716/111 |
| 6,571,786 | B2 * | 6/2003 | Summers et al. ............ 124/35.2 |
| 6,865,726 | B1 * | 3/2005 | Igusa et al. ..................... 716/105 |
| 7,146,583 | B1 * | 12/2006 | Sun et al. ....................... 716/113 |
| 2003/0208736 | A1 * | 11/2003 | Teng et al. ......................... 716/7 |
| 2004/0044969 | A1 * | 3/2004 | Miyamoto ......................... 716/1 |
| 2009/0077527 | A1 * | 3/2009 | Gergov et al. .................. 716/21 |
| 2009/0178014 | A1 * | 7/2009 | Fredrickson et al. ............. 716/2 |
| 2009/0235219 | A1 * | 9/2009 | Lin et al. ........................... 716/9 |

FOREIGN PATENT DOCUMENTS

JP 2006-301786 11/2006

* cited by examiner

*Primary Examiner* — Stacy Whitmore
(74) *Attorney, Agent, or Firm* — McDermott Will & Emery LLP

(57) ABSTRACT

An arrangement verification apparatus that makes it possible to shorten a time it takes to complete a failure/no-failure test on the arrangement of control circuits that control block circuits is provided. The arrangement verification apparatus arranges block circuits to be controlled comprising a semiconductor device and control circuits that control the block circuits over a predetermined floor and conducts a failure/no-failure test on the arrangement of the control circuits. The arrangement verification apparatus includes: a floor plan generation unit that arranges block circuits over a floor based on circuit specifications; a grouping generation unit that hierarchically groups the block circuits arranged over the floor and control circuits described in the circuit specifications based on a predetermined requirement to generate a group tree; a control circuit arrangement unit that arranges the control circuits over the floor according to a predetermined condition and the group tree generated at the grouping generation unit; and a failure/no-failure test unit that conducts a failure/no-failure test on the arrangement of the control circuits by the control circuit arrangement unit.

4 Claims, 9 Drawing Sheets

ARRANGEMENT VERIFICATION APPARATUS

CROSS-REFERENCE TO RELATED APPLICATIONS

The disclosure of Japanese Patent Application No. 2008-102229 filed on Apr. 10, 2008 including the specification, drawings and abstract is incorporated herein by reference in its entirety.

BACKGROUND OF THE INVENTION

The present invention relates to arrangement verification apparatus and in particular to an arrangement verification apparatus for verifying the arrangement of control circuits that control block circuits comprising a semiconductor device.

When designing is carried out to arrange block circuits to be controlled comprising a semiconductor device and control circuits for controlling the block circuits over a predetermined floor, the following practice has been conventionally done: a net list of a logic circuit portion is generated and then control circuits are manually inserted; and after an arrangement and wiring process, a failure/no-failure test is conducted. Specifically, a device for verifying the correctness of layout after the generation of a net list is disclosed in Patent Document 1.
[Patent Document 1]
Japanese Unexamined Patent Publication No. 2006-301786

SUMMARY OF THE INVENTION

However, conventional techniques involve problems. To determine the correctness of control circuitry with conventional techniques, it is required to prepare a net list of the entire circuit and to thereafter insert control circuits and couple wires before arrangement and wiring processing is carried out. Therefore, a long time (several days to several weeks) is required to complete a failure/no-failure test. With conventional techniques, in addition, it is difficult to try multiple types of circuitry different in the arrangement of control circuits in the development phase because of the time pressure, that is, the requirement of a long time to complete a failure/no-failure test.

Consequently, it is an object of the invention to provide an arrangement verification apparatus that makes it possible to shorten a time it takes to complete a failure/no-failure test on the arrangement of control circuits for controlling block circuits.

A means for solving the problems according to the invention is an arrangement verification apparatus with which block circuits to be controlled comprising a semiconductor device and control circuits controlling the block circuits are arranged over a predetermined floor and a failure/no-failure test is conducted on the arrangement of the control circuit. The arrangement verification apparatus includes: a floor plan generation unit that arranges block circuits over a floor based on circuit specifications; a grouping generation unit that hierarchically groups the block circuits arranged over the floor and control circuits described in the circuit specifications to generate a group tree; a control circuit arrangement unit that arranges the control circuits over the floor according to a predetermined condition and based on the group tree generated at the grouping generation unit; and a failure/no-failure test unit that conducts a failure/no-failure test on the arrangement of the control circuits by the control circuit arrangement unit.

In the arrangement verification apparatus according to the invention, the floor plan generation unit arranges block circuits over a floor according to circuit specifications; the grouping generation unit hierarchically groups the block circuits arranged over the floor and control circuits described in the circuit specifications according to a predetermined requirement to generate a group tree; the control circuit arrangement unit arranges the control circuits over the floor according to a predetermined condition and based on the group tree generated at the grouping generation unit; and the failure/no-failure test unit conducts a failure/no-failure test on the arrangement of the control circuit. Therefore, it is possible to shorten a time it takes to complete a failure/no-failure test on the arrangement of control circuits. Further, in the arrangement verification apparatus according to the invention, a net list and the like are unnecessary and a failure/no-failure test can be conducted according to circuit specifications. Therefore, design rework can be reduced and multiple arrangements can be examined. As a result, the most appropriate arrangement can be selected and the design quality is enhanced.

DETAILED DESCRIPTION OF THE PREFERRED EMBODIMENTS

First Embodiment

Figure 1:
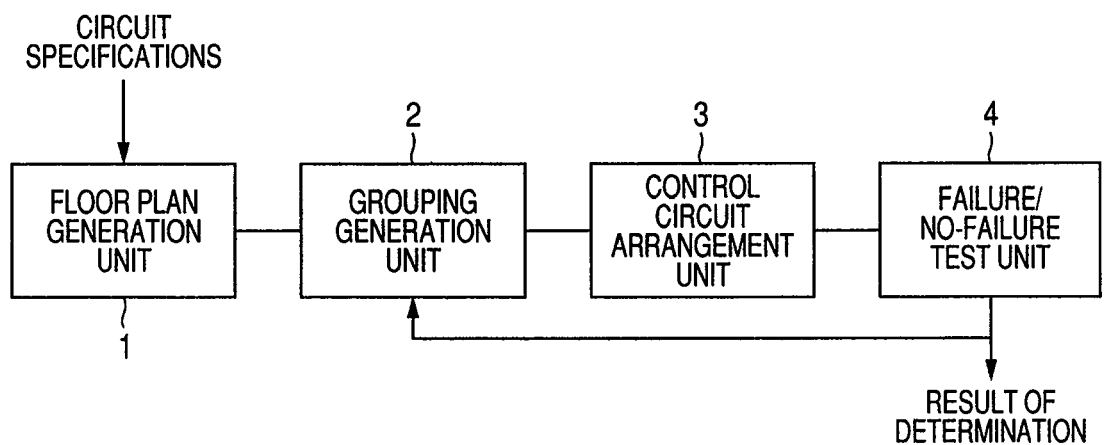
FIG. 1 is a block diagram of an arrangement verification apparatus in a first embodiment of the invention.

FIG. 1 is a block diagram of an arrangement verification apparatus in this embodiment. The arrangement verification apparatus illustrated in FIG. 1 includes a floor plan generation unit 1 that arranges block circuits over a floor according to circuit specifications. In the circuit specifications, there is described information that defines block circuits and control circuits comprising a semiconductor device. Examples of such information include information on the arrangement of block circuits over a floor, information on the hierarchy of control circuits, and the like. The semiconductor device handled by the arrangement verification apparatus of the invention is not limited to memory. When the semiconductor device is a memory, however, the block circuits are memory blocks and the control circuits are memory control circuits that control the memory blocks.

Figure 2:
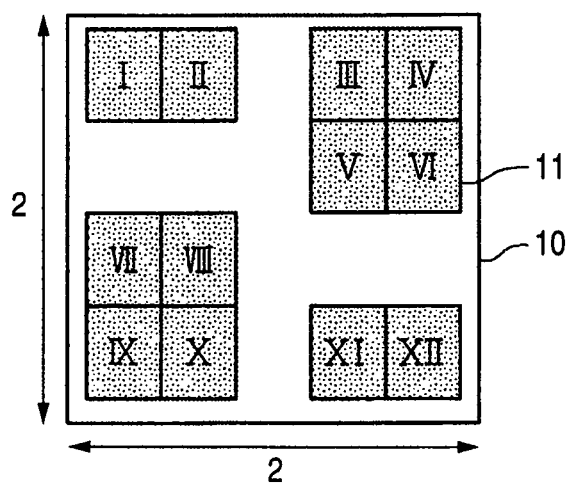
FIG. 2 is a drawing explaining a floor plan in the first embodiment of the invention.

FIG. 2 illustrates a floor plan generated by the floor plan generation unit 1. In the example in FIG. 2, 12 block circuits 11 are arranged in four clusters over a floor 10 of two units (arbitrary)×two units. That is, FIG. 2 shows four clusters of block circuits 11, block circuits I and II, block circuits III to VI, block circuits VII to X, and block circuits XI and XII.

Figure 3A:
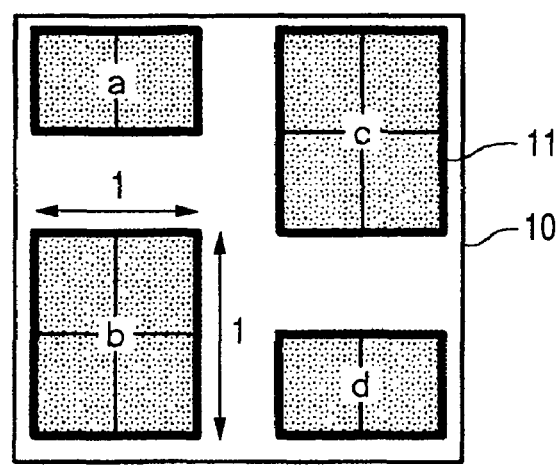
FIGS. 3(a) to 3(c) are drawing explaining the results of grouping block circuits in the first embodiment of the invention.
Figure 3B:
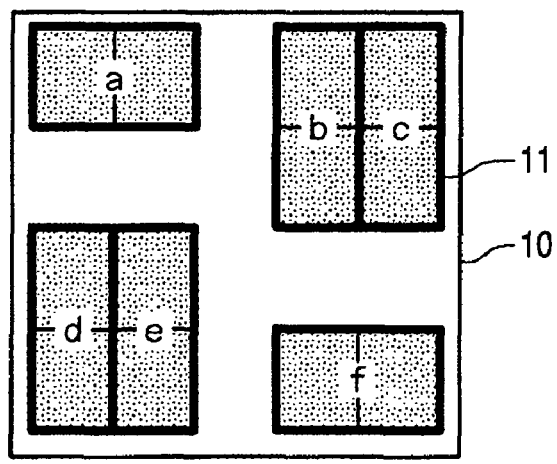
Figure 3C:
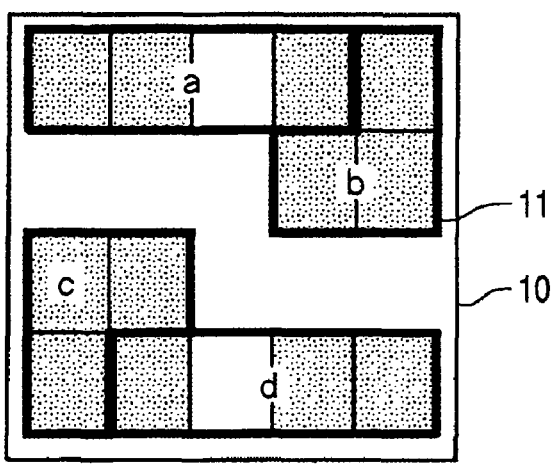

The grouping generation unit 2 illustrated in FIG. 1 groups the block circuits 11 on the floor plan illustrated in FIG. 2 according to a predetermined requirement. FIGS. 3(a) to 3(c) illustrate examples in which the block circuits 11 are grouped. According to the requirement for FIG. 3(a), block circuits 11 contained in one unit are grouped under distance restriction. That is, in the example in FIG. 3(a), the block circuits 11 are grouped as follows: block circuits I and II are organized into group a; block circuits III to VI are organized into group b; block circuits VII to X are organized into group c; and block circuits XI and XII are organized into group d.

According to the requirement for FIG. 3(b), the maximum number of blocks is limited to two under number of couplings restriction and the block circuits 11 are grouped. That is, in the example in FIG. 3(b), the block circuits 11 are grouped as follows: block circuits I and II are organized into group a; block circuits III and V are organized into group b; block circuits IV and VI are organized into group c; block circuits VII and IX are organized into group d; block circuits VIII and X are organized into group e; and block circuits XI and XII are organized into group f. According to the requirement for FIG. 3(c), the maximum number of blocks is limited to three under number of couplings restriction and the block circuits 11 are grouped. That is, in the example in FIG. 3(c), the block circuits 11 are grouped as follows: block circuits I to III are organized into group a; block circuits IV to VI are organized into group b; block circuits VII to IX are organized into group c; and block circuits X to XII are organized into group d.

In the description of this embodiment, the distance restriction and the number of couplings restriction are used as the predetermined requirements for grouping. However, the invention is not limited to this and block circuits may be grouped according to any other requirement or a requirement obtained by combining multiple requirements. Further, different requirements may be applied to individual hierarchies.

Figure 4A:
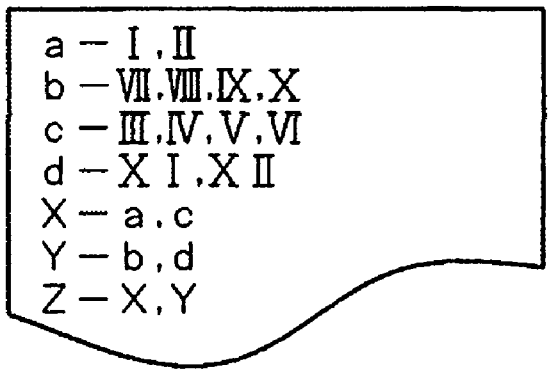
FIGS. 4(a) to 4(c) are drawings explaining group trees in the first embodiment of the invention.

The grouping generation unit 2 hierarchically groups the control circuits described in the circuit specifications. More specific description will be given. With respect to control circuits in the first hierarchy, the circuit specifications stipulate that the maximum number of coupled blocks is two for the block circuits 11 grouped in the example in FIG. 3(a). The control circuits are represented, for example, as X and Y in the group tree in FIG. 4(a). Control circuit X is coupled with group a and group b and control circuit Y is coupled with group c and group d.

Also with respect to control circuit in the second hierarchy, the maximum number of coupled blocks is limited to two in the circuit specifications. The control circuit is represented, for example, as Z in the group tree in FIG. 4(a). Control circuit Z is coupled with control circuit X and control circuit Y. As mentioned above, the grouping generation unit 2 generates a group tree of three-layer structure including the block circuits 11 and the control circuits (FIG. 4(a)) with respect to the floor plan in FIG. 3(a).

Figure 4B:
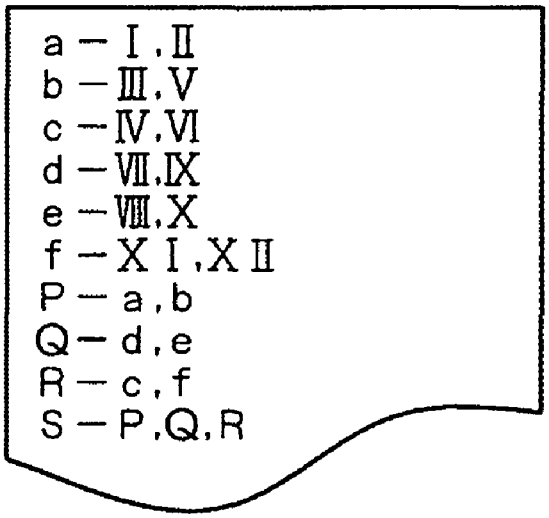

The grouping generation unit 2 similarly generates a group tree of three-layer structure including the block circuits 11 and the control circuits (FIG. 4(b)) with respect to the floor plan in FIG. 3(b). With respect to control circuit S in the second hierarchy, as indicated by the group tree in FIG. 4(b), the maximum number of coupled blocks is limited to three in the circuit specifications. Control circuit S is coupled with control circuit P, control circuit Q, and control circuit R.

Figure 4C:
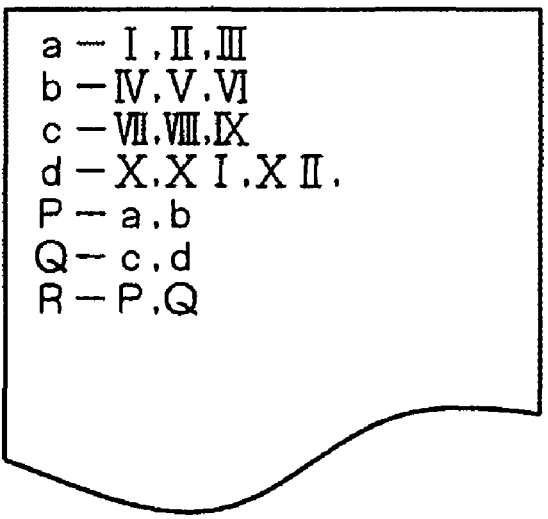

Further, the grouping generation unit 2 generates a group tree of three-layer structure including the block circuits 11 and the control circuits (FIG. 4(c)) with respect to the floor plan in FIG. 3(c). With respect to the hierarchy of the block circuits 11, the maximum number of blocks is limited to three as indicated by the group tree in FIG. 4(c). However, with respect to control circuit R in the first and second hierarchies, the maximum number of coupled blocks is limited to two in the circuit specifications. Therefore, control circuit P is coupled with group a and group b; control circuit Q is coupled with group c and group d; and control circuit R is coupled with control circuit P and control circuit Q.

The control circuit arrangement unit 3 illustrated in FIG. 1 arranges the control circuits over the floor 10 according to a predetermined condition and the group tree generated at the grouping generation unit 2. That is, representative points of the control circuits are virtually arranged over the floor 10 over which the block circuits 11 are grouped according to the group tree. The predetermined condition used at this time is as follows: the arrangement positions of the control circuits should be determined according to the number of control signals between the block circuits 11 and the control circuits or between a control circuit and a control circuit.

Figure 5A:
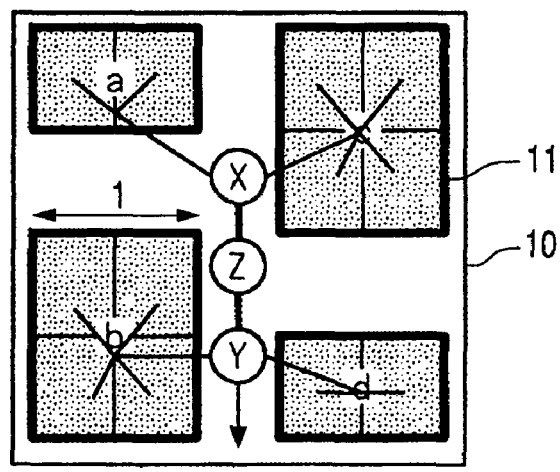
FIGS. 5(a) to 5(c) are drawings explaining the arrangements of control circuits in the first embodiment of the invention.

More specific description will be given. FIG. 5(a) illustrates the control circuits arranged according to the group tree in FIG. 4(a) with respect to the floor plan in FIG. 3(a). In FIG. 5(a), control circuit X is arranged between group a and group c. However, the number of control signals (number of couplings) between control circuit X and group a is two and the number of control signals (number of couplings) between control circuit X and group c is four; therefore, control circuit X is arranged closer to group c. In FIG. 5(a), similarly, control circuit Y is arranged between group b and group d. However, the number of control signals (number of couplings) between control circuit Y and group b is four and the number of control signals (number of couplings) between control circuit X and group d is two; therefore, control circuit Y is arranged closer to group b. In FIG. 5(a), further, control circuit Z is arranged between control circuit X and control circuit Y with the number of control signals (number of couplings) taken into account.

Figure 5B:
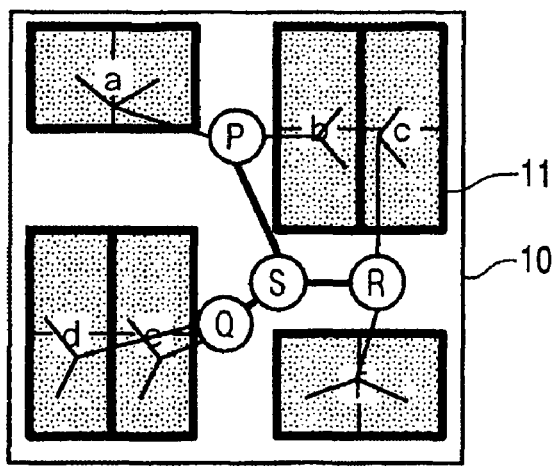

FIG. 5(b) illustrates another example in which the control circuits are arranged according to the group tree in FIG. 4(b) with respect to the floor plan in FIG. 3(b). In FIG. 5(b), control circuit P is arranged between group a and group b. However, the number of control signals (number of couplings) between control circuit P and group a is two and the number of control signals (number of couplings) between control circuit P and group b is two; therefore, control circuit P is arranged in a position at substantially equal distances therefrom. In FIG. 5(b), similarly, control circuit Q is arranged between group d and group e and control circuit R is arranged between group c and group f in respective positions with the number of control signals (number of couplings) taken into account. In FIG. 5(b), further, control circuit S is arranged between control circuit P, control circuit Q, and control circuit R with the number of control signals (number of couplings) taken into account.

Figure 5C:
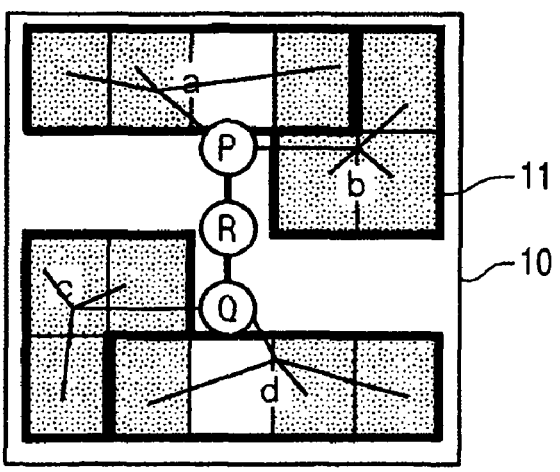

FIG. 5(c) illustrates a further example in which the control circuits are arranged according to the group tree in FIG. 4(c) with respect to the floor plan in FIG. 3(c). In FIG. 5(c), control circuit P is arranged between group a and group b. However, the number of control signals (number of couplings) between control circuit P and group a is three and the number of control signals (number of couplings) between control circuit P and group b is three; therefore, control circuit P is arranged in a position at substantially equal distances therefrom. In FIG. 5(c), similarly, control circuit Q is arranged between group c and group d. However, the number of control signals (number of couplings) between control circuit Q and group c is three and the number of control signals (number of couplings) between control circuit Q and group d is three; therefore, control circuit Q is arranged in a position at substantially equal distances therefrom. In FIG. 5(c), further, control circuit R is arranged between control circuit P and control circuit Q with the number of control signals (number of couplings) taken into account.

The failure/no-failure test unit 4 illustrated in FIG. 1 computes the total wiring length, the number of wiring intersections, and the like in the control circuits arranged as illustrated in FIGS. 5(a) to 5(c). It thereby determines the quality of the arrangement. Further, the failure/no-failure test unit 4 feeds the result of determination back to the grouping generation unit 2. Therefore, it is possible to conduct a failure/no-failure test also on control circuits according to a group tree corrected based on the result of determination and to determine more appropriate arrangement positions of the control circuits.

Description will be given to an arrangement verification method in the arrangement verification apparatus in this embodiment with reference to the flowchart shown in FIG. 6. The flow in the flowchart of FIG. 6 includes the steps of: determining circuit specifications first (S1); generating a floor plan based on the determined circuit specifications (S2); and grouping the block circuits and control circuits in the floor plan by hierarchy to generate a group tree (S3). The flow in the flowchart of FIG. 6 further includes the steps of: arranging control circuits with respect to each hierarchy according to the generated group tree (S4) and conducting a failure/no-failure test on the arranged control circuits (S5). The result obtained at the failure/no-failure test step (S5) is fed back to Step S1 or Step S3.

When the result obtained at the failure/no-failure test step (S5) is fed back to Step S1, it is possible to update circuit specifications with the result taken into account and verify the arrangement of the control circuits based on the new circuit specifications. When the result obtained at the failure/no-failure test step (S5) is fed back to Step S3, the group tree is updated to a group tree according to a different requirement with the result taken into account. The arrangement of the control circuits according to the new group tree can be verified. The flowchart illustrated in FIG. 6 includes multiple grouping generation steps (S3) and control circuit arrangement steps (S4) and this indicates that processing is carried out on a hierarchy-by-hierarchy basis. The processing of Step S2 to Step S5 corresponds to arrangement verification method A, which can be configured as software executed on a computer.

Figure 6:
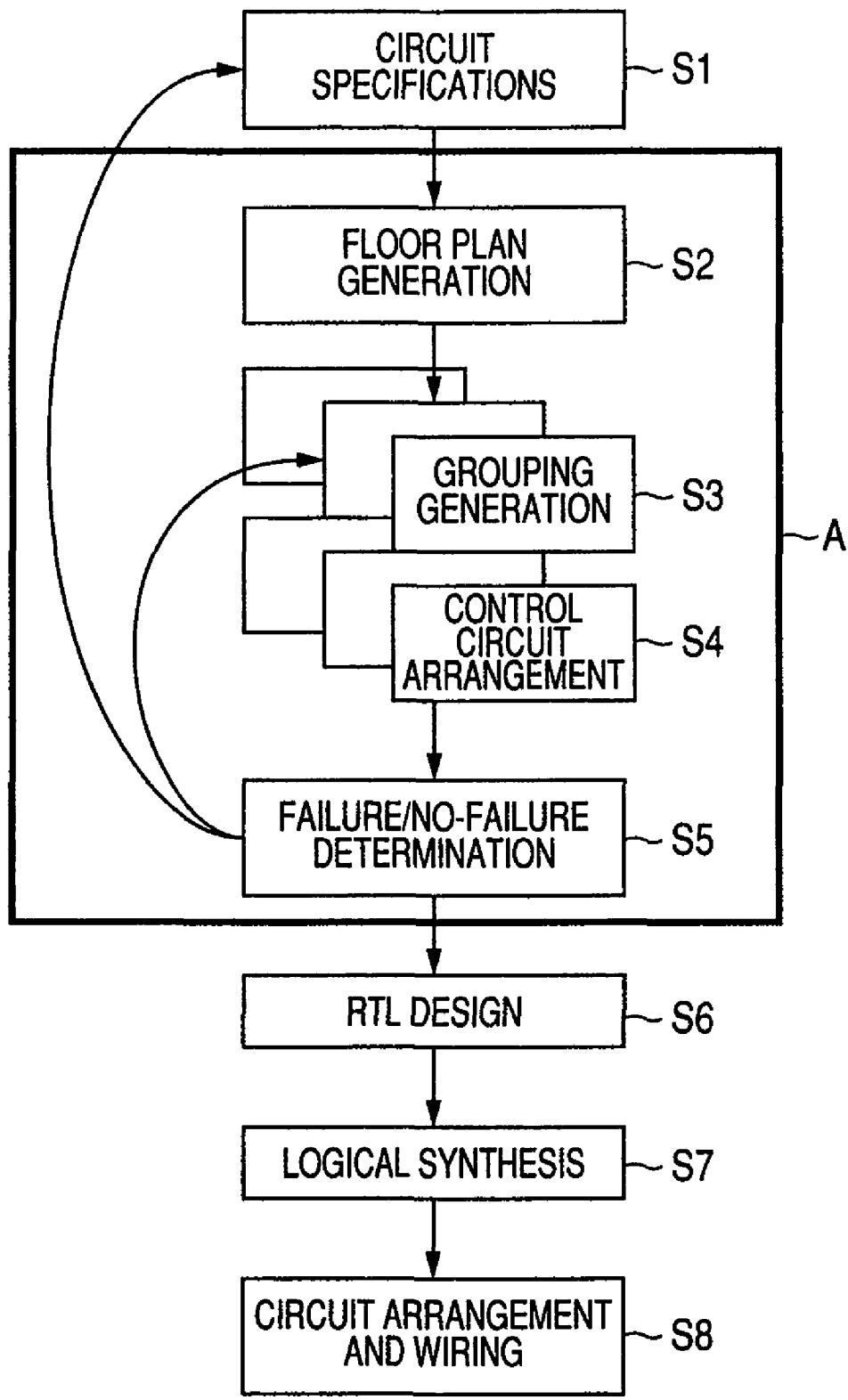
FIG. 6 is a flowchart of an arrangement verification method in the first embodiment of the invention.

The flow in the flowchart of FIG. 6 further includes the steps of: carrying out Register Transfer Level design (hereafter, also referred to as RTL design) with the arrangement of block circuits and control circuits determined as "no-failure" at Step S5 (S6); carrying out logical synthesis to generate a net list (S7); and carrying out circuit arrangement and wiring with the net list taken into account (S8). According to the flowchart illustrated in FIG. 6, it is possible to conduct a failure/no-failure test on the arrangement of control circuits before RTL design and carry out RTL design or logical synthesis based on the most appropriate arrangement of control circuits. In conventional cases, control circuits are manually inserted after RTL design and logical synthesis and a failure/no-failure test is conducted after the processing of arrangement and wiring involving block circuits and control circuits. Therefore, a long time is required to complete the processing. Further, it is required to go back to RTL design based on the result of the failure/no-failure test and this involves much design rework.

In the arrangement verification method in this embodiment, meanwhile, the arrangement of control circuits can be verified before RTL design as illustrated in FIG. 6. This shortens the time before the completion of processing and reduces design rework based on the result of failure/no-failure test. In the arrangement verification method in this embodiment, the time before the completion of processing is short and more arrangements can be verified; therefore, control circuits can be more appropriately arranged and the design quality is enhanced.

Figure 7A:
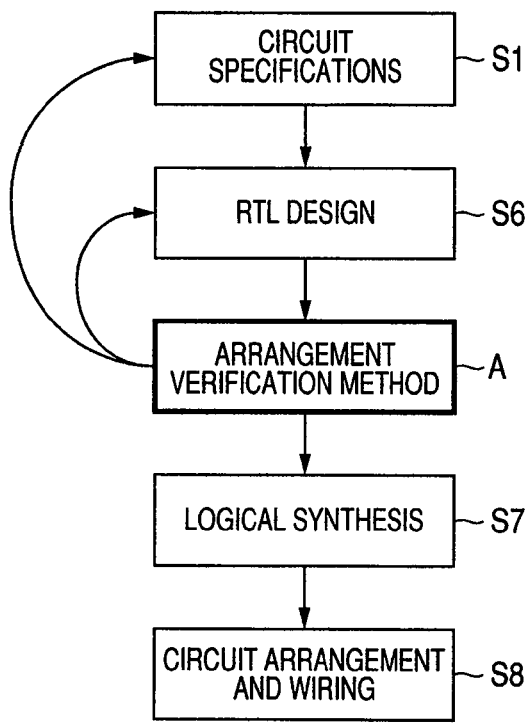
FIGS. 7(a) and 7(b) are flowcharts of other arrangement verification methods in the first embodiment of the invention.
Figure 7B:
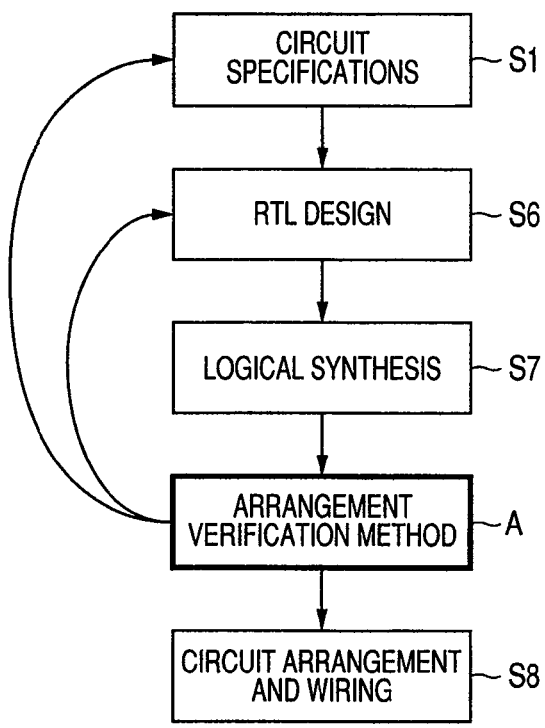

The arrangement verification method A in this embodiment need not be applied before RTL design (S6) as in the flowchart of FIG. 6. The arrangement verification method may be applied after RTL design (S6) as illustrated in FIG. 7(a) or after logical synthesis (S7) as illustrated in FIG. 7(b). In the flowchart illustrated in FIG. 7(a), the arrangement verification method A is applied after RTL design (S6) and before logical synthesis (S7) and the result of failure/no-failure test in the arrangement verification method A is fed back to the circuit specifications (S1) or RTL design (S6). In the flowchart illustrated in FIG. 7(b), the arrangement verification method A is applied after logical synthesis (S7) and the result of failure/no-failure test in the arrangement verification method A is fed back to the circuit specifications (S1) or RTL design (S6).

Second Embodiment

In the arrangement verification apparatus in this embodiment, the grouping generation unit 2 groups block circuits with domains taken into account unlike that in the first embodiment. In semiconductor devices, domains different in driving power supply may be formed over one floor sometimes. In such a case, block circuits included in domains different in driving power supply cannot be grouped together and thus the arrangement verification apparatus must take the domains into account when carrying out processing. Other domains formed in semiconductor devices include domains different in clock frequency, domains different in function, and the like.

The configuration of the arrangement verification apparatus in this embodiment is the same as the configuration illustrated in FIG. 1 and detailed description will be omitted. Circuit specifications in this embodiment describe domain information in addition to information that defines the block circuits and control circuits comprising a relevant semiconductor device. The domain information is information on block circuits respectively belonging to, for example, domains A and B different in driving voltage.

Figure 8:
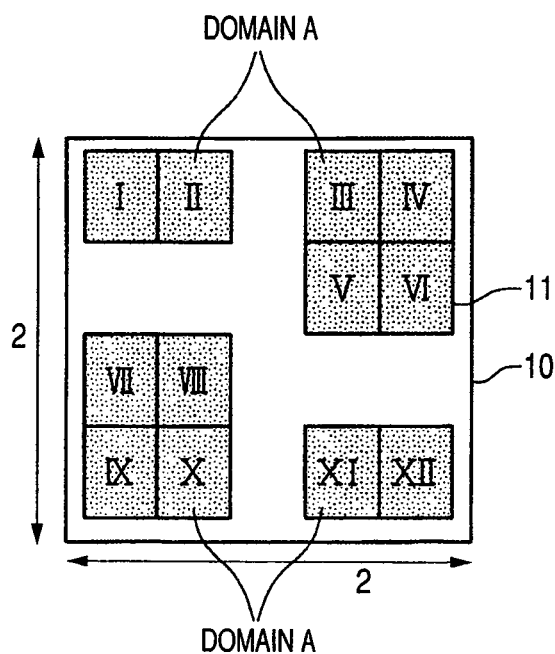
FIG. 8 is a drawing explaining a floor plan in a second embodiment of the invention.

FIG. 8 illustrates a floor plan generated by the floor plan generation unit 1 based on the circuit specifications. In the example in FIG. 8, 12 block circuits 11 are divided into domain A and domain B and arranged in four groups over a floor 10 of two units×two units. That is, FIG. 8 indicates that block circuits 11 belong to respective domains as follow:

block circuits I, II, and III to VI belong to domain A and block circuits VII to X, XI, and XII belong to domain B.

Figure 9A:
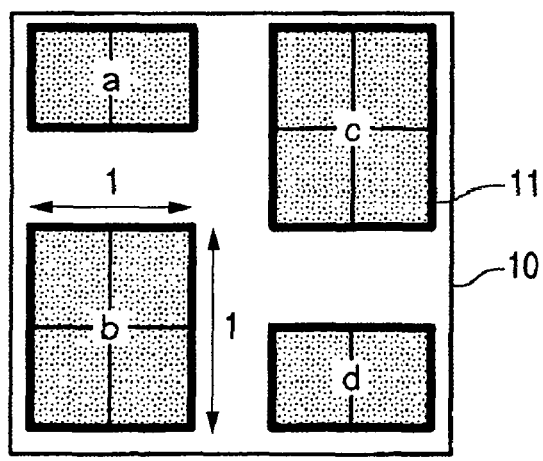
FIGS. 9(a) to 9(c) are drawings explaining the results of grouping block circuits in the second embodiment of the invention.
Figure 9B:
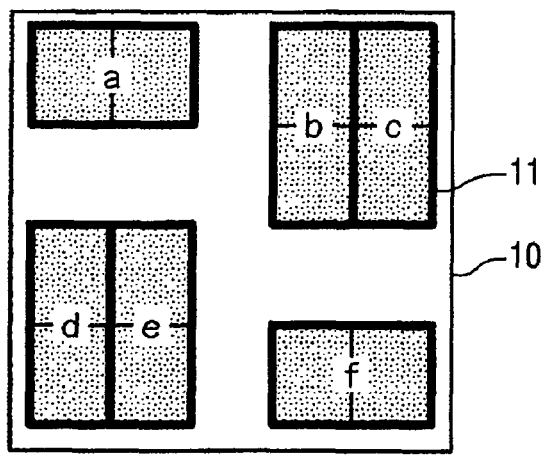
Figure 9C:
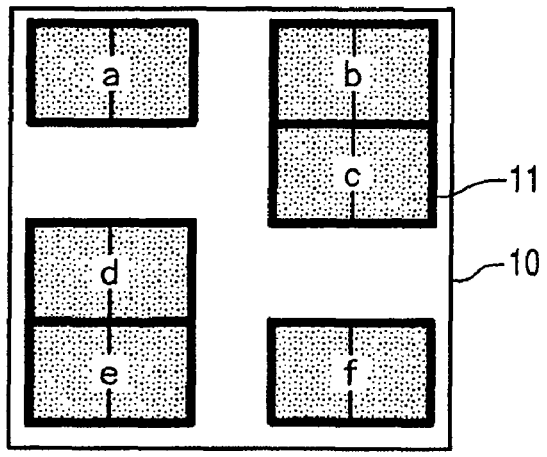

The grouping generation unit 2 illustrated in FIG. 1 groups the block circuits 11 on the floor plan illustrated in FIG. 8 according to a predetermined requirement. FIG. 9(a) to 9(c) illustrate examples in which the block circuits 11 are grouped. According to the requirement for FIG. 9(a), block circuits 11 included in one unit are grouped on a domain-by-domain basis under distance restriction. That is, in the example in FIG. 9(a), the block circuits 11 are grouped as follows: block circuits I and II are organized into group a; block circuits III to VI are organized into group c; block circuits VII to X are organized into group b; and block circuits XI and XII are organized into group d.

According to the requirement for FIG. 9(b), the maximum number of blocks is limited to two under number of couplings restriction and block circuits 11 are grouped on a domain-by-domain basis. That is, in the example in FIG. 9(b), the block circuits 11 are grouped as follows: block circuits I and II are organized into group a; block circuits III and V are organized into group b; block circuits IV and VI are organized into group c; block circuits VII and IX are organized into group d; block circuits VIII and X are organized into group e; and block circuits XI and XII are organized into group f. Also according to the requirement for FIG. 9(c), the maximum number of blocks is limited to two under number of couplings restriction and block circuits 11 are grouped on a domain-by-domain basis. (This is an example in which the same requirement as for FIG. 9(b) is applied and grouping is differently carried out.) That is, in the example in FIG. 9(c), the block circuits 11 are grouped as follows: block circuits I and II are organized into group a; block circuits III and IV are organized into group b; block circuits V and VI are organized into group c; block circuits VII and VIII are organized into group d; block circuits IX and X are organized into group e; and block circuit XI and XII are organized into group f.

Also in the description of this embodiment, the distance restriction and the number of couplings restriction are used as the predetermined requirements for grouping. However, the invention is not limited to this and block circuits may be grouped according to any other requirement or a requirement obtained by combining multiple requirements. Further, different requirements may be applied to individual hierarchies.

Figure 10A:
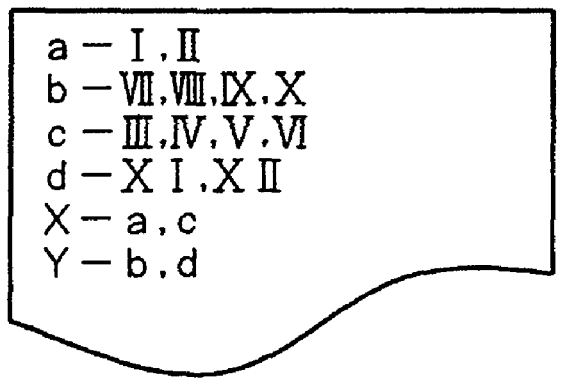
FIGS. 10(a) to 10(c) are drawing explaining group trees in the second embodiment of the invention.

The grouping generation unit 2 hierarchically groups the control circuits described in the circuit specifications. More specific description will be given. With respect to control circuits in the first hierarchy, the circuit specifications stipulate that the maximum number of blocks coupled in each domain is two for the block circuits 11 grouped in the example in FIG. 9(a). The control circuits are represented, for example, as X and Y in the group tree in FIG. 10(a). Control circuit X is coupled with group a and group c in the same domain and control circuit Y is coupled with group b and group d in the same domain. Since control circuit X and control circuit Y belong to different domains, control circuit Z does not exist unlike FIG. 4(a). As mentioned above, the grouping generation unit 2 generates a group tree of two-layer structure including the block circuits 11 and the control circuits (FIG. 10(a)) with respect to the floor plan in FIG. 9(a).

Figure 10B:
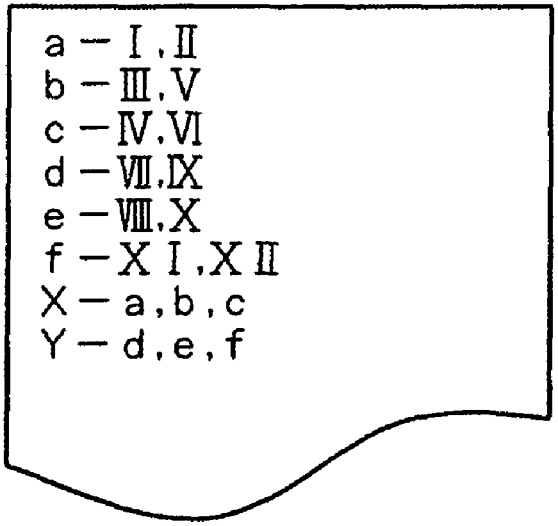

Similarly, the grouping generation unit 2 generates a group tree of two-layer structure including the block circuits 11 and the control circuits (FIG. 10(b)) with respect to the floor plan in FIG. 9(b). With respect to control circuit X in the first hierarchy, the maximum number of blocks coupled in each domain is limited to three in the circuit specifications as indicated by the group tree in FIG. 10(b). Control circuit X is coupled with groups a, b, and c and control circuit Y in the first hierarchy is coupled with groups d, e, and f.

Figure 10C:
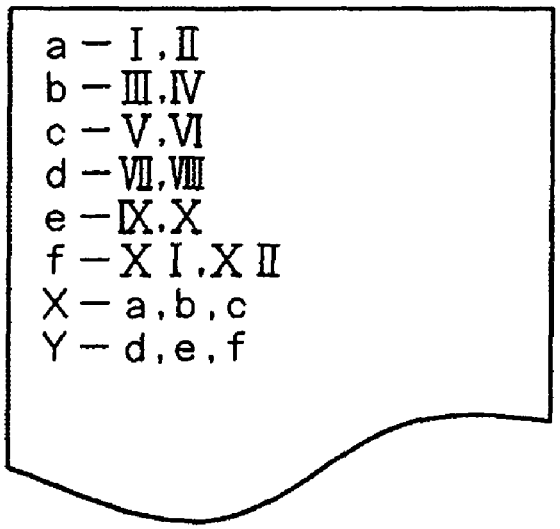

Further, the grouping generation unit 2 generates a group tree of two-layer structure including the block circuits 11 and the control circuits (FIG. 10(c)) with respect to the floor plan in FIG. 9(c). With respect to control circuit X in the first hierarchy, the maximum number of blocks coupled in each domain is limited to three in the circuit specifications as indicated by the group tree in FIG. 10(c). Control circuit is coupled with groups a, b, and c and control circuit Y in the first hierarchy is coupled with groups d, e, and f.

The control circuit arrangement unit 3 illustrated in FIG. 1 arranges the control circuits over the floor 10 on a domain-by-domain basis according to a predetermined condition and the group tree generated at the grouping generation unit 2. That is, representative points of the control circuits are virtually arranged over the floor 10 over which the block circuits 11 are grouped according to the group tree. The predetermined condition used at this time is as follows: the arrangement positions of the control circuits should be determined according to the number of control signals between the block circuits 11 and the control circuits or between a control circuit and a control circuit.

Figure 11A:
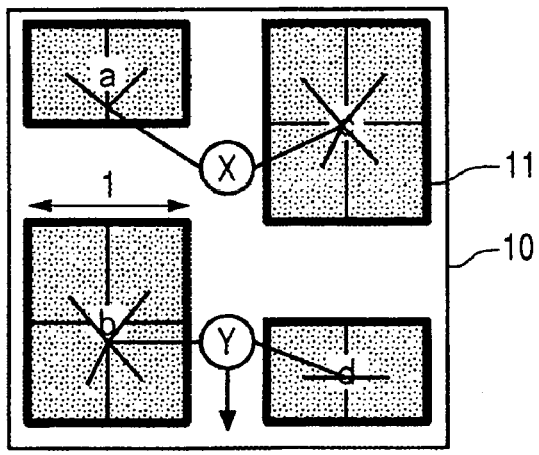
FIGS. 11(a) to 11(c) are drawings explaining the arrangements of control circuits in the second embodiment of the invention.

More specific description will be given. FIG. 11(a) illustrates the control circuits arranged according to the group tree in FIG. 10(a) with respect to the floor plan in FIG. 9(a). In FIG. 11(a), control circuit X is arranged between group a and group c. However, the number of control signals (number of couplings) between control circuit X and group a is two and the number of control signals (number of couplings) between control circuit X and group c is four; therefore, control circuit X is arranged closer to group c. In FIG. 11(a), similarly, control circuit Y is arranged between group b and group d. However, the number of control signals (number of couplings) between control circuit Y and group b is four and the number of control signals (number of couplings) between control circuit Y and group d is two; therefore, control circuit Y is arranged closer to group b. Since control circuit X and control circuit Y belong to different domains as illustrated in FIG. 11(a), they are not coupled together.

Figure 11B:
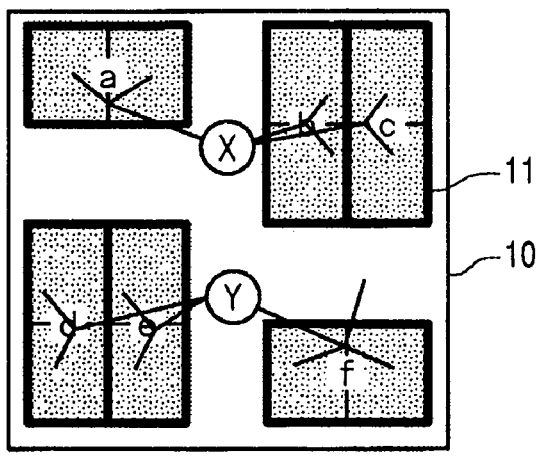

FIG. 11(b) illustrates another example in which the control circuits are arranged according to the group tree in FIG. 10(b) with respect to the floor plan in FIG. 9(b). In FIG. 11(b), control circuit X is arranged between groups a, b, and c. However, the number of control signals (number of couplings) between control circuit X and each group a, b, c is two; therefore, control circuit X is arranged in a position at substantially equal distances from the individual groups. Also in FIG. 11(b), similarly, control circuit Y is arranged between groups d, e, and f. However, the number of control signals (number of couplings) between control circuit Y and each group d, e, and f is two; therefore, control circuit Y is arranged in a position at substantially equal distances from the individual groups. Since control circuit X and control circuit Y belong to different domains as illustrated in FIG. 11(b), they are not coupled together.

Figure 11C:
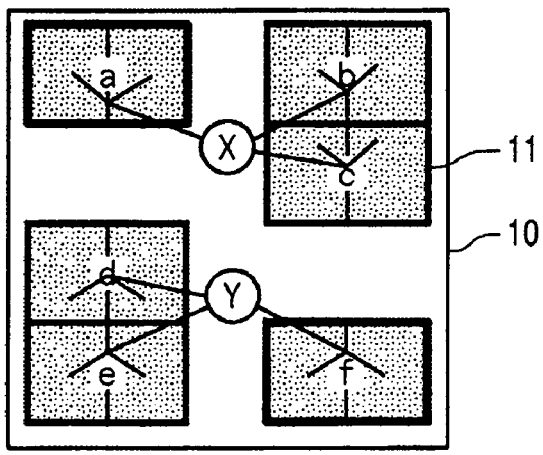

FIG. 11(c) illustrates a further example in which the control circuits are arranged according to the group tree in FIG. 10(c) with respect to the floor plan in FIG. 9(c). In FIG. 11(c), control circuit X is arranged between groups a, b, and c. However, the number of control signals (number of couplings) between control circuit X and each group a, b, c is two; therefore, control circuit X is arranged in a position at substantially equal distances from the individual groups. Also in FIG. 11(c), similarly, control circuit Y is arranged between groups d, e, and f. However, the number of control signals (number of couplings) between control circuit Y and each group d, e, f is two; therefore, control circuit Y is arranged in a position at substantially equal distances from the individual groups. Since control circuit X and control circuit Y belong to different domains as illustrated in FIG. 11(c), they are not coupled together.

The failure/no-failure test unit 4 illustrated in FIG. 1 computes the total wiring length, the number of wiring intersections, and the like in the control circuits arranged as illustrated in FIGS. 11(a) to 11(c). It thereby determines the quality of the arrangement. Further, the failure/no-failure test unit 4 feeds the result of determination back to the grouping generation unit 2. Therefore, it is possible to conduct a failure/no-failure test also on control circuits according to a group tree corrected based on the result of determination and to determine more appropriate arrangement positions of the control circuits.

With the arrangement verification apparatus in this embodiment, as described up to this point, the arrangement of control circuits can be verified with domains taken into account before the specification reviewing stage in RTL design or the net list generating stage in logical synthesis. As a result, design rework can be reduced. Further, the quality of a control circuit arrangement can be determined based on a floor plan for block circuits at a stage at which there is no net list and thus the design quality can be enhanced.

What is claimed is:

1. An arrangement verification apparatus which arranges, over a predetermined floor, block circuits to be controlled comprising a semiconductor device, and control circuits controlling the block circuits, and conducts a failure/no-failure test on the arrangement of the control circuits, comprising:

a floor plan generation unit arranging the block circuits over the floor based on circuit specifications;

a grouping generation unit hierarchically grouping the block circuits arranged over the floor and the control circuits described in the circuit specifications based on a predetermined requirement to generate a group tree;

a control circuit arrangement unit arranging the control circuits over the floor according to a predetermined condition and the group tree generated at the grouping generation unit; and a failure/no-failure test unit conducting a failure/no-failure test on the arrangement of the control circuits by the control circuit arrangement unit.

2. The arrangement verification apparatus according to claim 1, wherein the grouping generation unit is capable of setting the predetermined requirement on a hierarchy-by-hierarchy basis.

3. The arrangement verification apparatus according to claim 1 or claim 2, wherein the grouping generation unit groups the block circuits with domains taken into account.

4. The arrangement verification apparatus according to any of claim 1 to claim 3, wherein the predetermined condition in the control circuit arrangement unit is that the arrangement positions of the control circuits should be determined according to the number of control signals between the block circuits and the control circuits.

* * * * *